United States Patent
Delzer et al.

(10) Patent No.: US 6,369,659 B1
(45) Date of Patent: Apr. 9, 2002

(54) CLOCK RECOVERY SYSTEM USING WIDE-BANDWIDTH INJECTION LOCKED OSCILLATOR WITH PARALLEL PHASE-LOCKED LOOP

(75) Inventors: Donald J. Delzer, Beaverton, OR (US); Dan H. Wolaver, Westbrookfield, MA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/606,289

(22) Filed: Jun. 29, 2000

(51) Int. Cl.[7] .............................................. H03L 7/083
(52) U.S. Cl. .............................. 331/10; 331/25; 331/34; 375/376
(58) Field of Search .............................. 331/10, 25, 34; 375/376

(56) References Cited

U.S. PATENT DOCUMENTS

| | | | | |
|---|---|---|---|---|
| 4,918,406 A | * | 4/1990 | Baumbach et al. | ........... 331/34 |
| 5,650,749 A | * | 7/1997 | Main | ........................... 331/23 |

* cited by examiner

*Primary Examiner*—Siegfried H. Grimm
(74) *Attorney, Agent, or Firm*—Francis I. Gray; David N. Caracappa

(57) ABSTRACT

A clock recovery system includes a source of a data signal, and a free-running frequency adjustment circuit. The free-running frequency adjustment circuit includes an injection-locked oscillator having a free-running frequency and generating a clock signal and a phase locked loop, coupled in parallel with the injection locked oscillator, and generating a control signal adjusting the free running frequency of the injection locked oscillator.

5 Claims, 1 Drawing Sheet

CLOCK RECOVERY SYSTEM USING WIDE-BANDWIDTH INJECTION LOCKED OSCILLATOR WITH PARALLEL PHASE-LOCKED LOOP

BACKGROUND OF THE INVENTION

The present invention relates to a clock recovery system, and in particular to a high frequency, wide bandwidth clock recovery system.

Clock recovery is the process of synchronizing a local clock signal to a received data signal. That is, clock recovery time-aligns transitions in the received data signal with transitions of the local clock signal. When the local clock signal is synchronized to the received data signal, that clock signal may be used to synchronize the remainder of the signal processing circuitry in the receiver. Local oscillators in receivers are usually set during fabrication to a free-running frequency equal to the nominal frequency of the data signal. However, the frequency of the oscillator signal may not be set exactly to that nominal frequency, and/or the received data signal may not be at the nominal frequency, and/or the oscillator frequency may drift due to component aging in the oscillator or temperature variation during operation. When there are no data edges for a time, the oscillator is essentially free-running, and the phase of the free-running local oscillator will drift away from the phase of the received data signal.

In some cases, such as in test equipment, it is necessary that the clock recovery system have a relatively wide bandwidth. In such cases, injection-locked oscillators have been used. Injection-locked oscillators have a wide bandwidth, and are well suited for clock recovery systems used in such applications. An injection-locked oscillator, by itself, does not, however, correct the free-running frequency error in the local oscillator.

One solution to correcting the free-running frequency error in injection-locked oscillators is to periodically measure the free-running frequency of the oscillator when the circuit is not in service, and trim out the frequency error. This solution cannot be used, however, where the circuit is in use for long periods of time and where e.g. the temperature changes during operation, causing drift in the component characteristics and consequent drift in the free-running frequency of the oscillator.

Another solution to correcting the free-running frequency error in injection-locked oscillators is to measure the average (dc) phase error between the local oscillator clock signal and the received data signal. The dc phase error is proportional to the local oscillator free-running frequency error. The free-running frequency of the local oscillator is corrected to minimize the dc phase error. However, circuitry for measuring the dc phase error and correcting the free-running frequency is usually subject to the same changes (e.g. temperature changes) which cause the mistuning of the free-running frequency of the local oscillator in the first place.

Another solution to correcting the free-running frequency error in injection-locked oscillators is to include the injection-locked oscillator within a second order phase-locked loop. Such a phase-locked loop includes an integrator to eliminate the free running frequency error, described above. However, phase-locked loops which have the wide bandwidth required in such applications as test equipment are relatively complex. Second order phase-locked loops can be fabricated simply, but such loops have a relatively narrow bandwidth.

Another solution is disclosed in Ser. No. 091562,783 filed May 2, 2000 by Wolaver, incorporated by reference herein. In Ser. No. 091562,783 the inventor realized that in an injection locked oscillator the phase of the local clock signal is only adjusted (via the injection process) by transitions in the received data signal. In between those transitions, the relative phase between the received data signal and the local oscillator signal drifts due to the difference between the frequency of the received data signal and the free-running frequency of the local clock signal. The inventor also realized that during times where transitions in the received data signal are relatively sparse, the phase error will drift in one direction—as the local oscillator frequency drifts toward the free-running frequency. Similarly, during times where transitions in the received data signal are relatively dense, the phase error will be corrected in the opposite direction—as the local oscillator frequency is drawn back toward the frequency of the input signal. Thus, the inventor realized that by correlating the direction of the phase drift with the density of the transitions of the received data signal during operation of the system, the sign and magnitude of the free-running frequency error may be estimated. From this information, the free-running frequency of the local oscillator may be corrected to minimize the phase drift. Such correlation circuitry operates satisfactorily, but the circuitry can be relatively complex and expensive.

A clock recovery system using an injection-locked local oscillator to achieve wide bandwidth, and including a simple circuit for adjusting the free-running frequency of the local oscillator is desirable.

BRIEF SUMMARY OF THE INVENTION

In accordance with principles of the present invention, a clock recovery system includes a source of a data signal, and a free-running frequency adjustment circuit. The free-running frequency adjustment circuit includes an injection-locked oscillator having a free-running frequency and generating a clock signal and a phase locked loop, coupled in parallel with the injection locked oscillator, and generating a control signal adjusting the free running frequency of the injection locked oscillator.

DETAILED DESCRIPTION OF THE INVENTION

Figure 1:
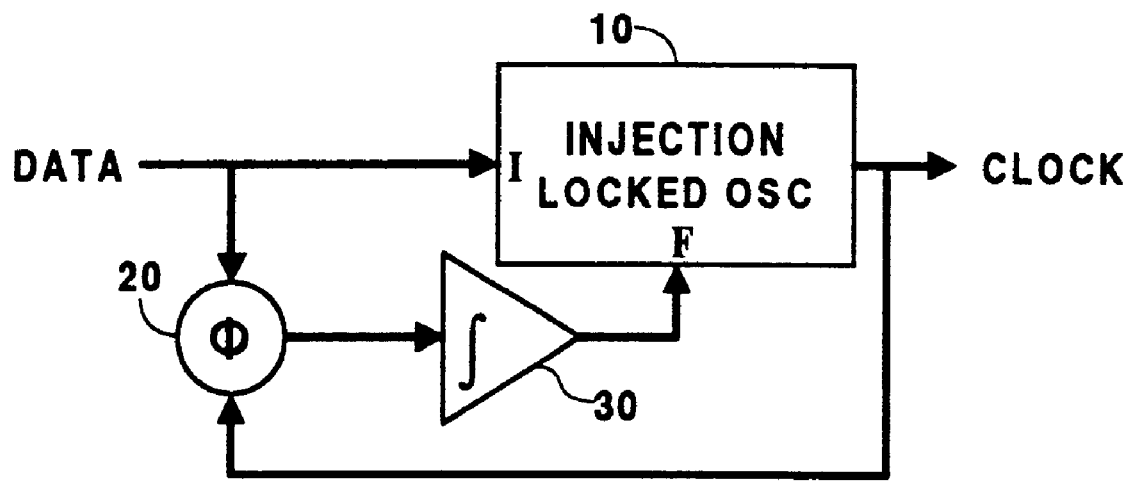
FIG. 1 is a block diagram of a clock recovery circuit according to principles of the present invention.

FIG. 1 is a block diagram of a clock recovery circuit according to principles of the present invention. In FIG. 1, a data input terminal DATA is coupled to a source (not shown) of a data input signal. The data input terminal DATA is coupled to an injection input terminal I of an injection locked oscillator 10. An output terminal of the injection locked oscillator 10 generates a clock signal and is coupled to a clock output terminal CLOCK. The clock output terminal CLOCK is coupled to further circuitry (not shown) for processing the data input signal in response to the clock signal.

The data input terminal DATA is also coupled to a first input terminal of a phase comparator 20, and the clock output terminal CLOCK is coupled to a second input terminal of the phase comparator 20. An output terminal of the phase comparator is coupled to an input terminal of a loop filter 30. An output terminal of the loop filter 30 is coupled to a free-running frequency adjustment terminal F of the injection locked oscillator 10.

In the illustrated embodiment, the data signal DATA carries successive data bits represented by a non-return-to-zero (NRZ) binary data signal having transition times at which the signal changes from one binary value to another. The transition times occur at a predetermined frequency, even though a transition may not occur at each transition time. Each transition of the data signal conditions the injection-locked local oscillator 10 to adjust the frequency of the local clock signal CLOCK toward the frequency of the data signal in a known manner. The clock signal CLOCK from the injection locked oscillator 10 is then supplied to the remainder of the system (not shown) and may be used to synchronize the processing of the data signal DATA, all in a known manner.

As described above, the free-running frequency of the injection locked oscillator 10 is set during fabrication to the nominal frequency of the data signal, though it may not be exactly the frequency of the actual received data signal. The difference between the data signal frequency and the free-running frequency of the injection locked oscillator 10 would, unless corrected, cause the relative phase between the data signal and the local clock signal to drift in a direction dependent on the relative frequencies of the injection locked oscillator 10 and the data signal.

During periods where transitions are sparse in the data input signal, the injection locked oscillator 10 has no transitions to synchronize to, and its frequency assumes the free-running frequency of the local oscillator. Therefore, during these intervals, the relative phase between the clock output signal CLOCK and the data input signal DATA would change linearly in a direction dependent on the relative frequencies, unless otherwise compensated by controlling the free-running frequency of the injection locked oscillator 10 in some manner. Conversely, during periods where the transitions are dense, the injection locked oscillator 10 is synchronized by the transitions in the data signal DATA, and its frequency moves from the free-running frequency toward the data input signal DATA frequency. During these intervals, the relative phase between the clock output signal CLOCK and the data input signal DATA changes exponentially in the opposite direction, unless otherwise compensated.

In operation, the phase comparator 20 compares the phase of the data input signal DATA to the clock output signal CLOCK to generate a signal representing the phase error between them. The phase error signal from the phase comparator 20 is filtered by the loop filter 30. The loop filter 30 has a relatively narrow bandwidth. The filtered signal is used to control the free-running frequency of the injection locked oscillator 10. The combination of the phase detector 20, loop filter 30 and injection locked oscillator 10 form a phase locked loop (PLL). This PLL is coupled in parallel with the injection locked oscillator 10.

The loop filter 30 of the phase locked loop includes an integrator, making the loop a second order loop, which is stable. The action of the phase locked loop is to steer the free-running frequency of the injection locked toward the frequency of the NRZ input data. Because, as described above, the bandwidth of this loop filter is designed to be relatively narrow, the filtered signal from the loop filter 30 represents the dc component of the phase error between the free-running frequency of the injection locked oscillator 10 and the data input signal DATA. Once the free-running frequency of the injection locked oscillator 10 has been matched to the frequency of the NRZ input data, the frequency difference between the free running frequency of the injection locked oscillator 10 and the NRZ input data signal changes very slowly. Such an arrangement allows the injection locked oscillator 10 to operate over its full bandwidth, while the free running frequency is controlled by a narrow bandwidth PLL to eliminate any phase drift during intervals when transitions are sparse in the data input signal.

What is claimed is:

1. A clock recovery system comprising:
   a source of a data signal;
   an injection-locked oscillator, coupled to the data signal source, having a free-running frequency and generating a clock signal; and
   a phase locked loop, coupled in parallel with the injection locked oscillator, and generating a control signal adjusting the free running frequency of the injection locked oscillator as a function of the clock signal and the data signal.

2. The system of claim 1 wherein the data signal source generates a non-return-to-zero binary data signal.

3. The system of claim 1 wherein:
   the injection locked oscillator includes an injection input terminal coupled to the data signal source, an output terminal generating the clock signal, and a free running frequency adjustment terminal;
   the phase locked loop comprises:
     a phase comparator having a first input terminal coupled to the data signal source, a second input terminal coupled to the output terminal of the injection locked oscillator, and an output terminal generating a phase error signal; and
     a loop filter having an input terminal coupled to the output terminal of the phase comparator and an output terminal coupled to the free running frequency adjustment terminal.

4. The system of claim 3 wherein the loop filter comprises an integrator.

5. The system of claim 2 wherein the phase locked loop is fabricated to have a relatively narrow bandwidth.

* * * * *